United States Patent
Shang

(10) Patent No.: US 11,830,571 B2
(45) Date of Patent: Nov. 28, 2023

(54) READ-WRITE CONVERSION CIRCUIT, READ-WRITE CONVERSION CIRCUIT DRIVING METHOD, AND MEMORY

(71) Applicant: Changxin Memory Technologies, Inc., Anhui (CN)

(72) Inventor: WeiBing Shang, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 336 days.

(21) Appl. No.: 17/356,775

(22) Filed: Jun. 24, 2021

(65) Prior Publication Data
US 2021/0319814 A1    Oct. 14, 2021

Related U.S. Application Data

(63) Continuation of application No. PCT/CN2020/103520, filed on Jul. 22, 2020.

(30) Foreign Application Priority Data

Nov. 27, 2019    (CN) .......................... 201911181058.X

(51) Int. Cl.
*G11C 7/10*        (2006.01)
*G06F 13/40*      (2006.01)

(52) U.S. Cl.
CPC ........ *G11C 7/1048* (2013.01); *G06F 13/4022* (2013.01); *G11C 7/1069* (2013.01); *G11C 7/1096* (2013.01)

(58) Field of Classification Search
CPC ... G11C 7/1048; G11C 7/1069; G11C 7/1096; G11C 7/1042; G11C 11/4096; G11C 5/025; G11C 11/409; G06F 13/4022
(Continued)

(56) References Cited

U.S. PATENT DOCUMENTS 9,281,027 B1 *  3/2016  Chen .................. G11C 11/4093
9,824,749 B1 * 11/2017  Nautiyal ............... G11C 11/413
(Continued)

FOREIGN PATENT DOCUMENTS

CN        103632178 A      3/2014
CN        104572559 A      4/2015
(Continued)

OTHER PUBLICATIONS

PCT International Preliminary Report on Patentability dated Jun. 9, 2022, issued in related International Application No. PCT/CN2020/103520, with English translation (9 pages).
(Continued)

*Primary Examiner* — Fernando Hidalgo
(74) *Attorney, Agent, or Firm* — Sheppard Mullin Richter & Hampton LLP

(57) ABSTRACT

A read-write conversion circuit, a read-write conversion circuit driving method, and a memory are provided. The read-write conversion circuit includes a first precharge circuit, a positive feedback circuit, a second precharge circuit, a fourth switch unit, a sixth switch unit, a seventh switch unit, an eighth switch unit, a tenth switch unit, an eleventh switch unit, a twelfth switch unit, a thirteenth switch unit, a fourteenth switch unit, and a fifteenth switch unit. In the read-write conversion circuit, corresponding signals can be read from a third signal terminal and a fourth signal terminal by using only one of a first signal terminal or a second signal terminal in a signal read stage, and corresponding signals can be written to the first signal terminal and the second signal terminal by using only one of the third signal terminal or the fourth signal terminal in a signal write stage.

20 Claims, 5 Drawing Sheets

(58) Field of Classification Search
USPC .................................................... 365/189.14
See application file for complete search history.

(56) References Cited

U.S. PATENT DOCUMENTS

| | | | | |
|---|---|---|---|---|
| 10,811,061 | B1* | 10/2020 | Venkata | G11C 7/08 |
| 11,264,081 | B1* | 3/2022 | Yu | G11C 11/4074 |
| 2002/0181307 | A1 | 12/2002 | Fifield et al. | |
| 2007/0081407 | A1* | 4/2007 | Maki | G11C 11/419 |
| | | | | 365/226 |
| 2010/0091581 | A1* | 4/2010 | Van Winkelhoff | G11C 11/412 |
| | | | | 365/207 |
| 2013/0077415 | A1* | 3/2013 | Joshi | G11C 7/04 |
| | | | | 365/189.14 |
| 2013/0235484 | A1 | 9/2013 | Liao et al. | |
| 2017/0148499 | A1* | 5/2017 | Matsui | G11C 7/06 |
| 2017/0236560 | A1 | 8/2017 | Matsui | |
| 2018/0090189 | A1* | 3/2018 | Yu | G11C 7/12 |

FOREIGN PATENT DOCUMENTS

| | | |
|---|---|---|
| CN | 108665917 A | 10/2018 |
| KR | 2014-0075363 A | 6/2014 |

OTHER PUBLICATIONS

Extended European Search Report dated Apr. 14, 2022, issued in related European Application No. 20894037.9 (11 pages).
Examination Report dated Feb. 1, 2023, issued in related European Application No. 20894037.9 (8 pages).
PCT International Search Report and the Written Opinion dated Oct. 29, 2020, issued in related International Application No. PCT/CN2020/103520, with partial English translation (9 pages).

* cited by examiner

READ-WRITE CONVERSION CIRCUIT, READ-WRITE CONVERSION CIRCUIT DRIVING METHOD, AND MEMORY

CROSS-REFERENCE TO RELATED APPLICATIONS

This application is a continuation application of International Patent Application No.: PCT/CN2020/103520, filed on Jul. 22, 2020, which claims priority to Chinese Patent Application No.: 201911181058.X, filed on Nov. 27, 2019. The above-referenced applications are incorporated herein by reference in their entirety.

TECHNICAL FIELD

The present invention relates to the field of storage technologies, and in particular, to a read-write conversion circuit, a read-write conversion circuit driving method, and a memory.

BACKGROUND

FIG. 1 is a schematic structural diagram of a dynamic random-access memory in the related art. The dynamic random-access memory usually includes a memory array 01, an SA (sense amplifier) array 02, an XDEC (row decoding circuit) 04, a YDEC (column decoding circuit) 03, and a read amplification circuit and write driver (SSA & write driver) circuit 05 of Gdata & Gdata# signals.

FIG. 2 is a partially enlarged diagram of FIG. 1. After a word line (WL) is selected (through XDEC decoding control), data is transmitted to the SAs on both upper and lower sides and is amplified by the SAs. Then, the amplified data is written back to a cell unit connected to the selected WL. When data needs to be changed or rewritten, a corresponding SA is selected through the YDEC column decoding, and the data is transmitted by a group of Gdata & Gdata# to a group of Ldata & Ldata# by using a local read-write conversion circuit (lrwap), and then written to a corresponding SA and a connected cell unit. When data is read, the data transmission may follow an opposite direction. A corresponding SA is selected through YDEC column decoding, and the data is transmitted to a group of Ldata & Ldata#, and then is transmitted to a group of Gdata &Gdata# by using a local read-write conversion circuit (lrwap). Finally, the data is amplified and output by an SSA (second sense amplifier).

FIG. 3 is a schematic structural diagram of an exemplary embodiment of a read-write conversion circuit in the related art. In the read-write conversion circuit, a signal may be read from a signal terminal Ldata to a signal terminal Gdata, and a signal may be read from a signal terminal Ldata# to a signal terminal Gdata#; and a signal on the signal terminal Gdata may be written to the signal terminal Ldata, and a signal on the signal terminal Gdata# may be written to the signal terminal Ldata#. In a write stage, the read-write conversion circuit may first write a reset voltage, through transistors T8, T9, and T10, to the signal terminals Ldata and Ldata#. Then, a valid level may be input to a signal terminal Wr to turn on transistors T1 and T2, so that a signal from the signal terminal Gdata may be written to the signal terminal Ldata, and a signal from the signal terminal Gdata# may be written to the signal terminal Ldata#. In a read stage, the read-write conversion circuit may first write a high-level signal to the signal terminals Gdata and the Gdata#. Then, a valid level may be input to a signal terminal Rd to turn on transistors T4, T6, and T7. When the signal terminal Ldata# is at a high level and Ldata is at a low level, T3 is turned on by the signal terminal Ldata#, so that a low-level signal from a ground terminal GND may be transmitted to the signal terminal Gdata. Simultaneously, T5 may be turned off by the signal terminal Ldata, and Gdata# may be kept at a high level. Likewise, when the signal terminal Ldata# is at a low level and Ldata is at a high level, Gdata# may be at a low level, and Gdata may be at a high level.

However, in the related art, in the read-write conversion circuit, during data writing and data reading, the signal terminals Gdata and Gdata# need to be in opposite complementary polarities. That is, levels of signals on the signal terminals Gdata and Gdata# need to be logically opposite. In the related art, the read-write conversion circuit has a relatively slow read-write speed, and a precharge driver component and a write driver component that are connected to the read-write conversion circuit have relatively large sizes and relatively high power consumption.

The information disclosed in the background part is only used to enhance the understanding of the background of the present invention and therefore may include information that does not constitute the prior art known to a person of ordinary skill in the art.

SUMMARY

According to one aspect of the present invention, a read-write conversion circuit is provided. The read-write conversion circuit may include a first precharge circuit, a positive feedback circuit, a second precharge circuit, a fourth switch unit, a sixth switch unit, a seventh switch unit, an eighth switch unit, a tenth switch unit, an eleventh switch unit, a twelfth switch unit, a thirteenth switch unit, a fourteenth switch unit, and a fifteenth switch unit.

The first precharge circuit may be connected to a first precharge control terminal, a first power supply terminal, a first signal terminal, and a second signal terminal, and is configured to transmit a signal of the first power supply terminal to the first signal terminal and the second signal terminal in response to a signal of the first precharge control terminal.

The positive feedback circuit may be connected to the first signal terminal, the second signal terminal, and a second power supply terminal, and is configured to transmit a signal of the second power supply terminal to the second signal terminal in response to a signal of the first signal terminal and simultaneously disconnect the first signal terminal and the second power supply terminal in response to a signal of the second signal terminal, and configured to transmit a signal of the second power supply terminal to the first signal terminal in response to a signal of the second signal terminal and simultaneously disconnect the second signal terminal and the second power supply terminal in response to a signal of the first signal terminal.

The second precharge circuit may be configured to precharge a voltage to a third signal terminal and a fourth signal terminal.

The fourth switch unit may have a control terminal connected to a first write control terminal, a first terminal connected to the third signal terminal, and a second terminal connected to the first signal terminal.

The sixth switch unit may have a control terminal connected to the third signal terminal, and a first terminal connected to the second signal terminal.

The seventh switch unit may have a control terminal connected to the first write control terminal, a first terminal connected to a second terminal of the sixth switch unit, and a second terminal connected to a third power supply terminal.

The eighth switch unit may have a control terminal connected to a second write control terminal, a first terminal connected to the second signal terminal, and a second terminal connected to the fourth signal terminal.

The tenth switch unit may have a control terminal connected to the fourth signal terminal, and a first terminal connected to the first signal terminal.

The eleventh switch unit may have a control terminal connected to the second write control terminal, a first terminal connected to a second terminal of the tenth switch unit, and a second terminal connected to the third power supply terminal.

The twelfth switch unit may have a control terminal connected to the second signal terminal, and a first terminal connected to the third signal terminal.

The thirteenth switch unit may have a control terminal connected to a first read control terminal, a first terminal connected to a second terminal of the twelfth switch unit, and a second terminal connected to the third power supply terminal.

The fourteenth switch unit may have a control terminal connected to the first signal terminal, and a first terminal connected to the fourth signal terminal.

The fifteenth switch unit may have a control terminal connected to a second read control terminal, a first terminal connected to a second terminal of the fourteenth switch unit, and a second terminal connected to the third power supply terminal.

In some embodiments, the positive feedback circuit may include a fifth switch unit and a ninth switch unit. The fifth switch unit may have a control terminal connected to the first signal terminal, a first terminal connected to the second power supply terminal, and a second terminal connected to the second signal terminal. The ninth switch unit may have a control terminal connected to the second signal terminal, a first terminal connected to the second power supply terminal, and a second terminal connected to the first signal terminal.

In some embodiments, the first precharge circuit may include a first switch unit, a second switch unit, and a third switch unit. The first switch unit may have a control terminal connected to the first precharge control terminal, a first terminal connected to the first power supply terminal, and a second terminal connected to the first signal terminal. The second switch unit may have a control terminal connected to the first precharge control terminal, a first terminal connected to the first power supply terminal, and a second terminal connected to the second signal terminal. The third switch unit may have a control terminal connected to the first precharge control terminal, a first terminal connected to the first signal terminal, and a second terminal connected to the second signal terminal.

In some embodiments, the fifth switch unit may be a P-type transistor, and the sixth switch unit is an N-type transistor. The signal of the second power supply terminal may be a high-level signal, and a signal of the third power supply terminal may be a low-level signal.

In some embodiments, the fifth switch unit may be an N-type transistor, and the sixth switch unit may be a P-type transistor. The signal of the second power supply terminal may be a low-level signal, and a signal of the third power supply terminal may be a high-level signal.

In some embodiments, the ninth switch unit may be a P-type transistor, and the tenth switch unit may be an N-type transistor. The signal of the second power supply terminal may be a high-level signal, and a signal of the third power supply terminal may be a low-level signal.

In some embodiments, the ninth switch unit may be an N-type transistor, and the tenth switch unit may be a P-type transistor. The signal of the second power supply terminal may be a low-level signal, and a signal of the third power supply terminal may be a high-level signal.

In some embodiments, the twelfth switch unit may be an N-type transistor. The signal of the third power supply terminal may be a low-level signal, and the second precharge circuit may be configured to precharge a high-level signal to the third signal terminal and the fourth signal terminal.

In some embodiments, the twelfth switch unit may be a P-type transistor. The signal of the third power supply terminal may be a high-level signal, and the second precharge circuit may be configured to precharge a low-level signal to the third signal terminal and the fourth signal terminal.

In some embodiments, the fourteenth switch unit may be an N-type transistor. The signal of the third power supply terminal may be a low-level signal, and the second precharge circuit may be configured to precharge a high-level signal to the third signal terminal and the fourth signal terminal.

In some embodiments, the fourteenth switch unit may be a P-type transistor. The signal of the third power supply terminal may be a high-level signal, and the second precharge circuit may be configured to precharge a low-level signal to the third signal terminal and the fourth signal terminal.

According to another aspect of the present invention, a read-write conversion circuit driving method is provided for driving any one of the foregoing read-write conversion circuits.

The method may include a signal write stage and a signal read stage.

The signal write stage may include a first write stage and a second write stage.

The first write stage may include inputting a valid level signal to the first precharge control terminal to transmit a signal of the first power supply terminal to the first signal terminal and the second signal terminal in response to the valid level signal of the first precharge control terminal by using the first precharge circuit.

The second write stage may include inputting a first to-be-written signal to the third signal terminal to transmit the first to-be-written signal of the third signal terminal to the first signal terminal in response to a signal of the first write control terminal and transmit a signal of the second power supply terminal to the second signal terminal in response to a signal of the first signal terminal, or transmit a signal of the third power supply terminal to the second signal terminal in response to a signal of the first write control terminal and a signal of the third signal terminal; and simultaneously writing a second to-be-written signal to the fourth signal terminal.

Alternatively, the second write stage may include inputting a third to-be-written signal to the fourth signal terminal to transmit the third to-be-written signal of the fourth signal terminal to the second signal terminal in response to a signal of the second write control terminal and transmit a signal of the second power supply terminal to the first signal terminal in response to a signal of the second signal terminal, or transmit a signal of the third power supply terminal to the first signal terminal in response to a signal of the second write control terminal and a signal of the fourth signal terminal; and simultaneously writing a fourth to-be-written signal to the third signal terminal.

The signal read stage may include a first read stage and a second read stage.

The first read stage may include precharging a voltage to the third signal terminal and the fourth signal terminal by using the second precharge circuit.

The second read stage may include inputting a valid level signal to the first read control terminal to transmit a signal of the third power supply terminal to the third signal terminal in response to a signal of the second signal terminal and a signal of the first read control terminal; and simultaneously precharging a voltage to the fourth signal terminal by using the second precharge circuit.

Alternatively, the second read stage may include inputting a valid level signal to the second read control terminal to transmit a signal of the third power supply terminal to the fourth signal terminal in response to a signal of the first signal terminal and a signal of the second read control terminal; and simultaneously precharging a voltage to the third signal terminal by using the second precharge circuit.

According to another aspect of the present invention, a memory is provided. The memory may include any one of the foregoing read-write conversion circuits.

According to another aspect of the present invention, a read-write conversion circuit is provided. In the read-write conversion circuit, corresponding signals can be read from a third signal terminal and a fourth signal terminal by using only one of a first signal terminal or a second signal terminal in a signal read stage, and corresponding signals can be written to the first signal terminal and the second signal terminal by using only one of the third signal terminal or the fourth signal terminal in a signal write stage.

The foregoing general descriptions and the following detailed descriptions are merely examples and explanations and do not limit the present invention.

BRIEF DESCRIPTION OF THE DRAWINGS

The accompanying drawings herein are incorporated in the specification to become a part of the specification, show embodiments that are in accordance with the present invention, and are used with the specification to explain the principle of the present invention. The accompanying drawings in the following descriptions show merely some embodiments of the present invention. A person of ordinary skill in the art may still derive other accompanying drawings from these accompanying drawings without creative efforts.

DETAIL DESCRIPTION OF THE EMBODIMENTS

The exemplary embodiments are comprehensively described with reference to the accompanying drawings. The exemplary embodiments can be implemented in a plurality of forms and are not intended to be limited to embodiments described herein. On the contrary, providing these embodiments makes the present invention more comprehensive and complete, and the concepts of the exemplary embodiments are comprehensively conveyed to a person skilled in the art. Same reference signs in the figures represent same or similar structures and therefore are not repeatedly described in detail.

Although relative terms such as "on" and "under" are used in the specification to describe a relative relationship of a component with a reference sign to another component with a reference sign, these terms are used in the specification for convenience only, for example, indicate directions in the examples described according to the accompanying drawings. If an apparatus with a reference sign is inverted, a component described to be "on" becomes a component described to be "under". Other relative terms such as "high", "low", "top", "bottom", "left", and "right" have similar meanings. When a structure is "on" another structure, it may mean that the structure is integrated onto another structure, or that the structure is "directly" disposed on another structure, or that the structure is "indirectly" disposed on another structure by using another structure.

The terms "one", "a", and "the" are used to indicate the existence of one or more elements/components/etc. The terms "include" and "have" are used to indicate open inclusion and the existence of an element/a component/etc. in addition to the listed element/component/etc.

Figure 1:
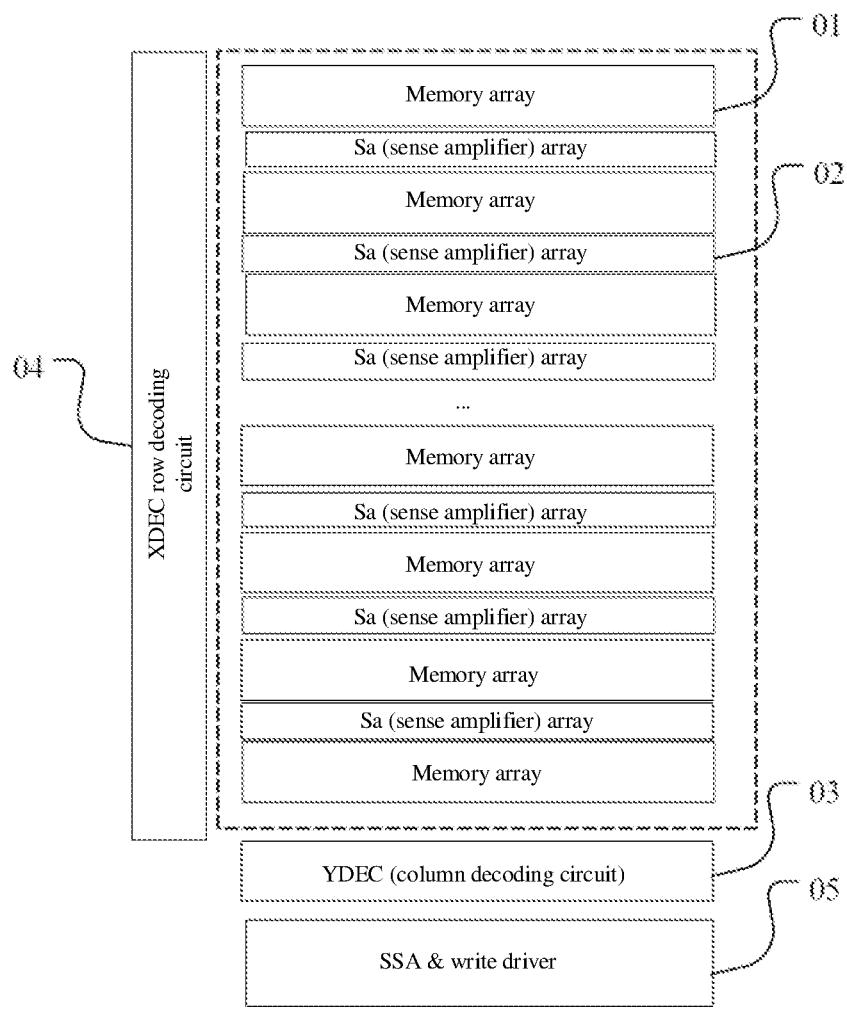
FIG. 1 is a schematic structural diagram of a dynamic random-access memory in the related art.
Figure 2:
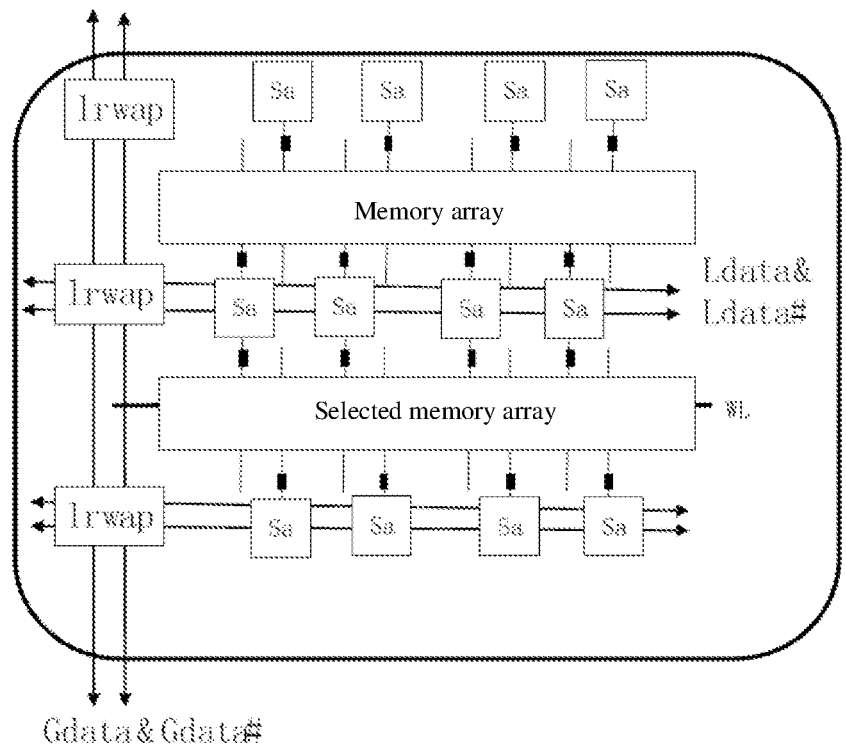
FIG. 2 is a partially enlarged diagram of FIG. 1.
Figure 3:
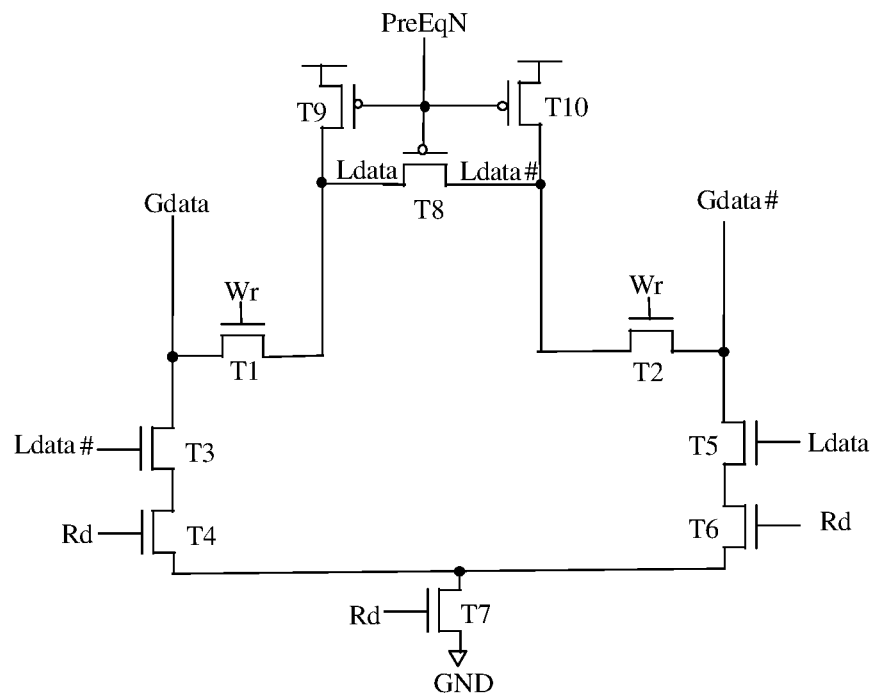
FIG. 3 is a schematic structural diagram of an exemplary embodiment of a read-write conversion circuit in the related art.
Figure 4:
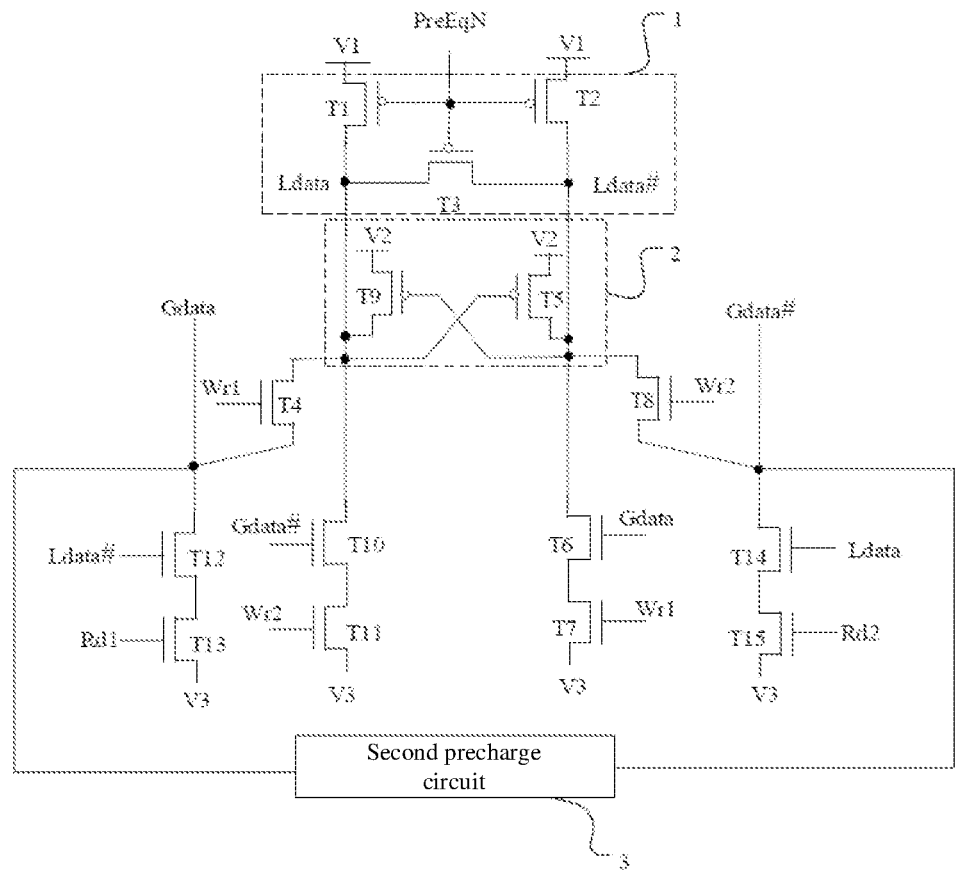
FIG. 4 is a schematic structural diagram of an exemplary embodiment of a read-write conversion circuit according to the present invention.

This specification first provides a read-write conversion circuit. FIG. 4 is a schematic structural diagram of an exemplary embodiment of a read-write conversion circuit according to the present invention.

The read-write conversion circuit may include a first precharge circuit 1, a positive feedback circuit 2, a second precharge circuit 3, a fourth switch unit T4, a sixth switch unit T6, a seventh switch unit T7, an eighth switch unit T8, a tenth switch unit T10, an eleventh switch unit T11, a twelfth switch unit T12, a thirteenth switch unit T13, a fourteenth switch unit T14, and a fifteenth switch unit T15.

The first precharge circuit 1 may be connected to a first precharge control terminal PreEqN, a first power supply terminal V1, a first signal terminal Ldata, and a second signal terminal Ldata#.

The first precharge circuit 1 may be configured to transmit a signal of the first power supply terminal V1 to the first signal terminal Ldata and the second signal terminal Ldata# in response to a signal of the first precharge control terminal PreEqN.

The positive feedback circuit 2 may be connected to the first signal terminal Ldata, the second signal terminal Ldata#, and a second power supply terminal V2.

The positive feedback circuit 2 may be configured to transmit a signal of the second power supply terminal V2 to the second signal terminal Ldata# in response to a signal of the first signal terminal Ldata and simultaneously disconnect the first signal terminal Ldata and the second power supply terminal V2 in response to a signal of the second signal terminal Ldata#. The positive feedback circuit 2 may be further configured to transmit a signal of the second power supply terminal V2 to the first signal terminal Ldata# in response to a signal of the second signal terminal Ldata# and simultaneously disconnect the second signal terminal Ldata# and the second power supply terminal V2 in response to a signal of the first signal terminal Ldata.

The second precharge circuit 3 may be configured to precharge a voltage to a third signal terminal Gdata and a fourth signal terminal Gdata#.

The fourth switch unit T4 may have a control terminal connected to a first write control terminal Wr1, a first terminal connected to the third signal terminal Gdata, and a second terminal connected to the first signal terminal Ldata.

The sixth switch unit T6 may have a control terminal connected to the third signal terminal Gdata, and a first terminal connected to the second signal terminal Ldata#.

The seventh switch unit T7 may have a control terminal connected to the first write control terminal Wr1, a first terminal connected to a second terminal of the sixth switch unit T6, and a second terminal connected to a third power supply terminal V3.

The eighth switch unit T8 may have a control terminal connected to a second write control terminal Wr2, a first terminal connected to the second signal terminal Ldata#, and a second terminal connected to the fourth signal terminal Gdata#.

The tenth switch unit T10 may have a control terminal connected to the fourth signal terminal Gdata#, and a first terminal connected to the first signal terminal Ldata.

The eleventh switch unit T11 may have a control terminal connected to the second write control terminal Wr2, a first terminal connected to a second terminal of the tenth switch unit T10, and a second terminal connected to the third power supply terminal V3.

The twelfth switch unit T12 may have a control terminal connected to the second signal terminal Ldata#, and a first terminal connected to the third signal terminal Gdata.

The thirteenth switch unit T13 may have a control terminal connected to a first read control terminal Rd1, a first terminal connected to a second terminal of the twelfth switch unit T12, and a second terminal connected to the third power supply terminal V3.

The fourteenth switch unit T14 may have a control terminal connected to the first signal terminal Ldata, and a first terminal connected to the fourth signal terminal Gdata#.

The fifteenth switch unit T15 may have a control terminal connected to a second read control terminal Rd2, a first terminal connected to a second terminal of the fourteenth switch unit T14, and a second terminal connected to the third power supply terminal V3.

In the read-write conversion circuit disclosed herein, corresponding signals can be read from a third signal terminal and a fourth signal terminal by using only one of a first signal terminal or a second signal terminal in a signal read stage, and corresponding signals can be written to the first signal terminal and the second signal terminal by using only one of the third signal terminal or the fourth signal terminal in a signal write stage.

On the one hand, through the two-stage pipeline described above, a usage period of the third signal terminal and the fourth signal terminal increases from the original tCCD (an interval between adjacent write commands) to tCCD×2. Thus, the time sequence requirement can be significantly relaxed, or, in other words, the read-write speed can be further improved. On the other hand, a precharge or prewrite operation may be performed on the third or the fourth signal terminals that is idle so that a read-write signal has more time to work, thereby reducing the sizes and the power consumption of the precharge driver component and the write driver component.

In some embodiments, the first precharge circuit 1 may include a first switch unit T1, a second switch unit T2, and a third switch unit T3. The first switch unit T1 may have a control terminal connected to the first precharge control terminal PreEqN, a first terminal connected to the first power supply terminal V1, and a second terminal connected to the first signal terminal Ldata. The second switch unit T2 may have a control terminal connected to the first precharge control terminal PreEqN, a first terminal connected to the first power supply terminal V1, and a second terminal connected to the second signal terminal Ldata#. The third switch unit T3 may have a control terminal connected to the first precharge control terminal PreEqN, a first terminal connected to the first signal terminal Ldata, and a second terminal connected to the second signal terminal Ldata#.

A precharge operation may need to be performed on the read-write conversion circuit before read-write driving. In a precharge phase, a valid level signal may be input to the first precharge control terminal PreEqN to close the first switch unit T1, the second switch unit T2, and the third switch unit T3. The first power supply terminal V1 may precharge a reset level to the first signal terminal Ldata and the second signal terminal Ldata#. In this specification, to "close" a switch unit may mean to put the switch unit in the conducting state.

In some embodiments, the positive feedback circuit 2 may include a fifth switch unit T5 and a ninth switch unit T9. The fifth switch unit T5 may have a control terminal connected to the first signal terminal Ldata, a first terminal connected to the second power supply terminal V2, and a second terminal connected to the second signal terminal Ldata#. The ninth switch unit T9 may have a control terminal connected to the second signal terminal Ldata#, a first terminal connected to the second power supply terminal V2, and a second terminal connected to the first signal terminal Ldata.

In some embodiments, the fifth switch unit T5 may be a P-type transistor, and the sixth switch unit may be an N-type transistor. Correspondingly, the signal of the second power supply terminal V2 may be a high-level signal, and a signal of the third power supply terminal V3 may be a low-level signal.

In the read-write conversion circuit, signals can be written to the first signal terminal Ldata and the second signal terminal Ldata# by using the third signal terminal Gdata. When a signal of the third signal terminal Gdata is a high-level signal, a valid level signal may be input to Wr1 to close the fourth switch unit T4 and the seventh switch unit T7 to transmit the signal of the third signal terminal Gdata to the first signal terminal Ldata. Simultaneously, the high-level signal of the third signal terminal Gdata may cause the sixth switch unit to be closed to transmit the low-level signal of the third power supply terminal V3 to the second signal terminal Ldata#. When a signal of the third signal terminal Gdata is a low-level signal, a valid level signal may be input to Wr1 to close the fourth switch unit T4 to transmit the signal of the third signal terminal Gdata to the first signal terminal Ldata. Simultaneously, the low-level signal of the first signal terminal Ldata may cause the fifth switch unit T5 to be closed to transmit the high-level signal of the second power supply terminal V2 to the second signal terminal Ldata#. Simultaneously, the high-level signal of the second signal terminal Ldata# may cause the ninth switch unit T9 to be open so that the low-level signal of the first signal terminal Ldata may not be affected by the high-level signal of the second power supply terminal V2. In this specification, a switch unit is "closed" may mean the switch unit is in the conducting state, and a switch unit is "open" may mean the switch unit is in the cutoff state.

In some embodiments, the ninth switch unit may be a P-type transistor, and the tenth switch unit may be an N-type transistor. Correspondingly, the signal of the second power supply terminal V2 may be a high-level signal, and a signal of the third power supply terminal V3 may be a low-level signal. In the read-write conversion circuit, signals can be written to the first signal terminal Ldata and the second signal terminal Ldata# by using the fourth signal terminal Gdata#. When a signal of the fourth signal terminal Gdata# is a high-level signal, a valid level signal is input to Wr2 to close the eighth switch unit T8 and the eleventh switch unit T11 to transmit the signal of the fourth signal terminal Gdata# to the second signal terminal Ldata#. Simultaneously, the high-level signal of the fourth signal terminal Gdata# may cause the tenth switch unit T10 to be closed to transmit the low-level signal of the third power supply terminal V3 to the first signal terminal Ldata. When a signal of the fourth signal terminal Gdata# is a low-level signal, a valid level signal may be input to Wr2 to close the eighth switch unit T8 to transmit the signal of the fourth signal terminal Gdata# to the second signal terminal Ldata#. Simultaneously, the low-level signal of the second signal terminal Ldata# may cause the ninth switch unit T9 to be closed to transmit the high-level signal of the second power supply terminal V2 to the first signal terminal Ldata. Simultaneously, the high-level signal of the first signal terminal Ldata may cause the fifth switch unit T5 to be open so that the low-level signal of the second signal terminal Ldata# may not be affected by the high-level signal of the second power supply terminal V2.

In some embodiment, the twelfth switch unit may be an N-type transistor. Correspondingly, a signal of the third power supply terminal V3 may be a low-level signal, and the second precharge circuit 3 may be configured to precharge a high-level signal to the third signal terminal Gdata and the fourth signal terminal Gdata#. In the read-write conversion circuit, signals can be read from the third signal terminal Gdata and the fourth signal terminal Gdata# by using the second signal terminal Ldata#. When the signal of the second signal terminal Ldata# is a high-level signal, the twelfth switch unit T12 may be closed. Simultaneously, a valid level signal may be input to the first read control terminal Rd1 to close the thirteenth switch unit T13 to transmit the low-level signal of the third power supply terminal V3 to the third signal terminal Gdata. Simultaneously, the fourth signal terminal Gdata# may maintain the high-level signal that is precharged by the second precharge circuit to the fourth signal terminal Gdata#.

In some embodiments, the fourteenth switch unit may be an N-type transistor. Correspondingly, a signal of the third power supply terminal V3 may be a low-level signal, and the second precharge circuit 3 may be configured to precharge a high-level signal to the third signal terminal Gdata and the fourth signal terminal Gdata#. In the read-write conversion circuit, signals can be read from the third signal terminal Gdata and the fourth signal terminal Gdata# by using the first signal terminal Ldata. When the signal of the first signal terminal Ldata is a high-level signal, the fourteenth switch unit T14 may be closed. Simultaneously, a valid level signal may be input to the second read control terminal Rd2 to close the fifteenth switch unit T15 to transmit the low-level signal of the third power supply terminal V3 to the fourth signal terminal Gdata#. Simultaneously, the third signal terminal Gdata may maintain the high-level signal that is precharged by the second precharge circuit to the third signal terminal Gdata.

In some embodiments, the first switch unit T1, the second switch unit T2, the third switch unit T3, the fourth switch unit T4, the seventh switch unit T7, the eighth switch unit T8, the ninth switch unit T9, the eleventh switch unit T11, the thirteenth switch unit T13, and the fifteenth switch unit T15 may be P-type transistors or N-type transistors.

As shown in FIG. 4, in some embodiments, for example, the first switch unit T1, the second switch unit T2, and the third switch unit T3 may be P-type transistors, and the fourth switch unit T4, the seventh switch unit T7, the eighth switch unit T8, the ninth switch unit T9, the eleventh switch unit T11, the thirteenth switch unit T13, and the fifteenth switch unit T15 may be N-type transistors.

This specification further presents a read-write conversion circuit driving method for driving any one of the foregoing read-write conversion circuits.

Figure 5:
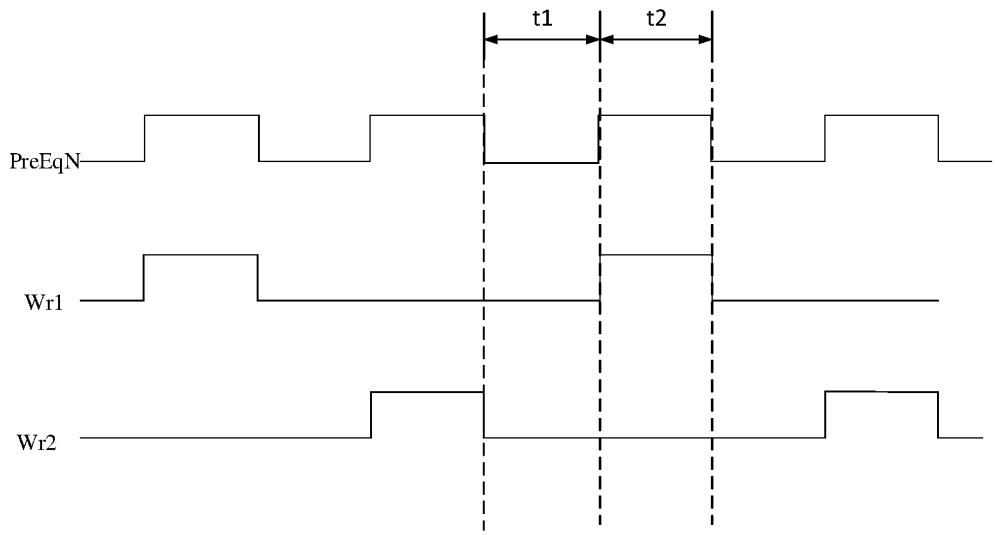
FIG. 5 is a time sequence diagram of nodes in an exemplary embodiment of a read-write conversion circuit according to the present invention.

In some embodiments, the driving method may include a signal read stage and a signal write stage. FIG. 5 is a time sequence diagram of nodes in an exemplary embodiment of a read-write conversion circuit according to the present invention.

As shown in FIG. 5, the signal write stage may include a first write stage t1 and a second write stage t2. In the first write stage t1, the first precharge control terminal PreEqN may be at a low level, the first write control terminal Wr1 and the second write control terminal Wr2 may be at a low level, and the first precharge circuit may precharge a reset signal to the first signal terminal Ldata and the second signal terminal Ldata#. In the second write stage t2, the first write control terminal Wr1 may be at a high level, and the second write control terminal Wr2 may be at a low level, so that signals can be written to the first signal terminal Ldata and the second signal terminal Ldata# by using the third signal terminal Gdata.

In this case, the fourth signal terminal Gdata# may be a free terminal, and a data signal may be precharged to the fourth signal terminal Gdata# to write signals to the first signal terminal Ldata and the second signal terminal Ldata# by using the fourth signal terminal Gdata# in the next signal write stage.

Figure 6:
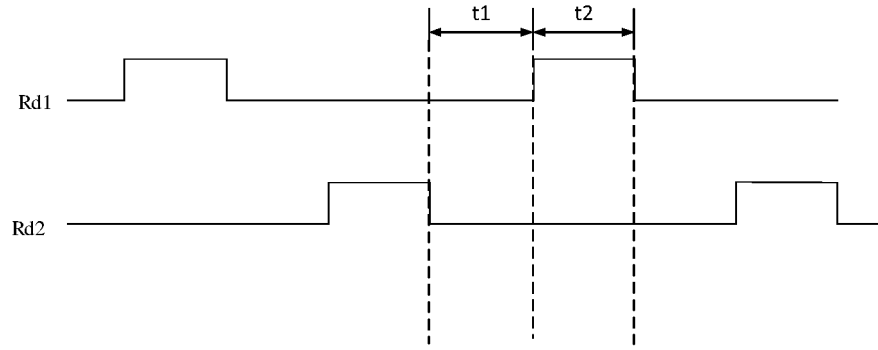
FIG. 6 is a time sequence diagram of nodes in another exemplary embodiment of a read-write conversion circuit according to the present invention.

FIG. 6 is a time sequence diagram of nodes in another exemplary embodiment of a read-write conversion circuit according to the present invention.

As shown in FIG. 6, the signal read stage includes a first read stage t1 and a second read stage t2. In the first read stage t1, the second precharge circuit may precharge a high-level signal to the third signal terminal Gdata and the fourth signal terminal Gdata#. In the second read stage t2, when the signal of the first signal terminal Ldata is a low-level signal and the signal of the second signal terminal Ldata# is a high-level signal, a high-level signal may be input to the first read control terminal Rd1 to close the thirteenth switch unit, and the high-level signal of the second signal terminal Ldata# may cause the twelfth switch unit T12 to be closed to transmit a low-level signal of the third power supply terminal to the third signal terminal Gdata. The fourth signal terminal may maintain the high-level signal that is precharged by the second precharge circuit to the fourth signal terminal in the first stage t1.

In this case, the fourth signal terminal Gdata# may be a free terminal, and a precharge operation for the next signal read stage may be performed on the fourth signal terminal Gdata#.

Likewise, when the signal of the first signal terminal Ldata is a high-level signal and the signal of the second signal terminal Ldata# is a low-level signal, a high-level signal may be input to the second read control terminal Rd2 to close the fifteenth switch unit T15, and the high-level signal of the first signal terminal Ldata causes the fourteenth switch unit T14 to be closed to transmit a low-level signal of the third power supply terminal to the fourth signal terminal Gdata#. The third signal terminal may maintain the high-level signal that is precharged by the second precharge circuit to the third signal terminal in the first stage.

In this case, the third signal terminal Gdata may be a free terminal, and a precharge operation for the next signal read stage may be performed on the third signal terminal Gdata.

Figure 7:
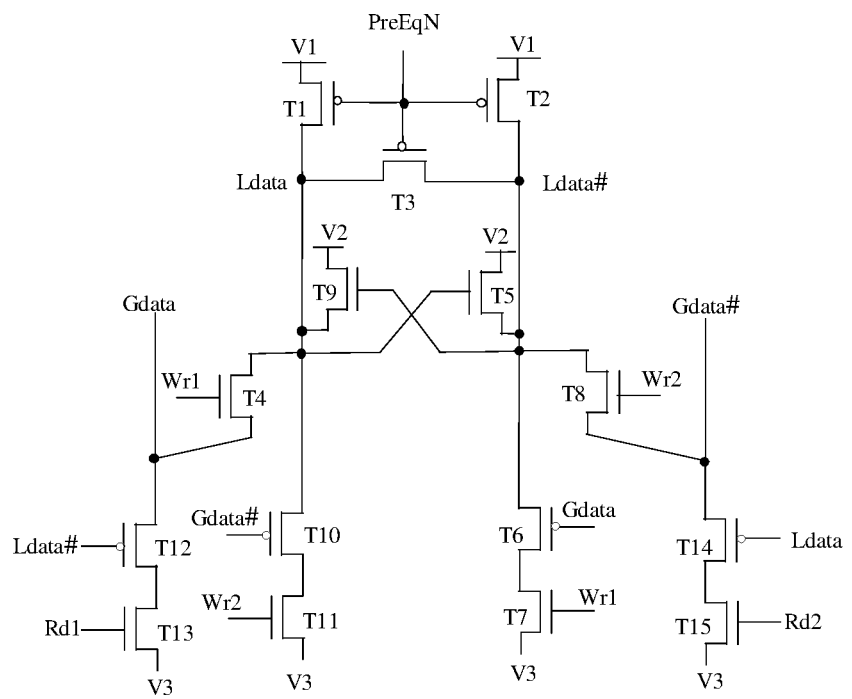
FIG. 7 is a schematic structural diagram of another exemplary embodiment of a read-write conversion circuit according to the present invention.

FIG. 7 is a schematic structural diagram of another embodiment of a read-write conversion circuit according to this specification. In this embodiment, the fifth switch unit T5 may be an N-type transistor, the sixth switch unit T6 may be a P-type transistor, the ninth switch unit T9 may be an N-type transistor, and the tenth switch unit T10 may be a P-type transistor. Correspondingly, the signal of the second power supply terminal V2 may be a low-level signal, and the signal of the third power supply terminal V3 may be a high-level signal.

In this embodiment, the twelfth switch unit T12 may be a P-type transistor, and the fourteenth switch unit T14 may be a P-type transistor. Correspondingly, the second precharge circuit 3 may be configured to precharge a low-level signal to the third signal terminal Gdata and the fourth signal terminal Gdata#. In this embodiment, the first switch unit T1, the second switch unit T2, the third switch unit T3, the fourth switch unit T4, the seventh switch unit T7, the eighth switch unit T8, the ninth switch unit T9, the eleventh switch unit T11, the thirteenth switch unit T13, and the fifteenth switch unit T15 may be P-type transistors or N-type transistors.

As shown in FIG. 7, in this embodiment, the first switch unit T1, the second switch unit T2, and the third switch unit T3 may be P-type transistors, and the fourth switch unit T4, the seventh switch unit T7, the eighth switch unit T8, the ninth switch unit T9, the eleventh switch unit T11, the thirteenth switch unit T13, and the fifteenth switch unit T15 may be N-type transistors. A driving method of the read-write conversion circuit provided in this embodiment is the same as the driving method of the read-write conversion circuit shown in FIG. 4, and details are not repeatedly described herein.

Figure 8:
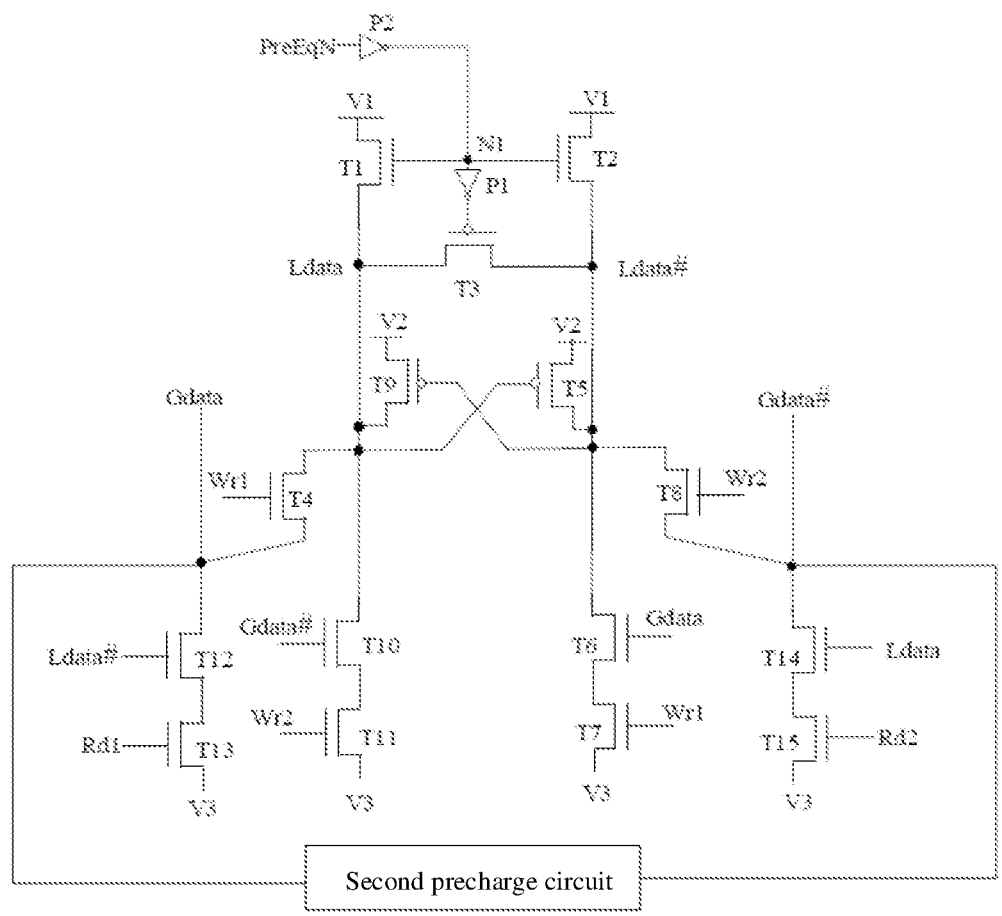
FIG. 8 is a schematic structural diagram of another exemplary embodiment of a read-write conversion circuit according to the present invention.

FIG. 8 is a schematic structural diagram of another embodiment of a read-write conversion circuit according to this specification. In this read-write conversion circuit, the first switch unit T1 and the second switch unit T2 may be N-type transistors, and the third switch unit may be a P-type transistor. The first precharge control terminal PreEqN may be connected to a first node N1 by using a second phase inverter P2. Control terminals of the first switch unit T1 and the second switch unit T2 may both be connected to the first node N1, and a control terminal of the third switch unit T3 may be connected to the first node N1 by using a first phase inverter P1.

This specification further provides a read-write conversion circuit driving method for driving the foregoing read-write conversion circuit.

The method may include a signal write stage and a signal read stage.

The signal write stage may include a first write stage and a second write stage. The first write stage may include: inputting a valid level signal to the first precharge control terminal to transmit a signal of the first power supply terminal to the first signal terminal and the second signal terminal in response to the valid level signal of the first precharge control terminal by using the first precharge circuit.

The second write stage may include: inputting a first to-be-written signal to the third signal terminal to transmit the first to-be-written signal of the third signal terminal to the first signal terminal in response to a signal of the first write control terminal and transmit a signal of the second power supply terminal to the second signal terminal in response to a signal of the first signal terminal, or transmit a signal of the third power supply terminal to the second signal terminal in response to a signal of the first write control terminal and a signal of the third signal terminal; and simultaneously writing a second to-be-written signal to the fourth signal terminal.

Alternatively, the second write stage may include: inputting a third to-be-written signal to the fourth signal terminal to transmit the third to-be-written signal of the fourth signal terminal to the second signal terminal in response to a signal of the second write control terminal and transmit a signal of the second power supply terminal to the first signal terminal in response to a signal of the second signal terminal, or transmit a signal of the third power supply terminal to the first signal terminal in response to a signal of the second write control terminal and a signal of the fourth signal terminal; and simultaneously writing a fourth to-be-written signal to the third signal terminal.

The signal read stage may include a first read stage and a second read stage.

The first read stage may include: precharging a voltage to the third signal terminal and the fourth signal terminal by using the second precharge circuit.

The second read stage may include: inputting a valid level signal to the first read control terminal to transmit a signal of the third power supply terminal to the third signal terminal in response to a signal of the second signal terminal and a signal of the first read control terminal; and simultaneously precharging a voltage to the fourth signal terminal by using the second precharge circuit.

Alternatively, the second read stage may include: inputting a valid level signal to the second read control terminal to transmit a signal of the third power supply terminal to the fourth signal terminal in response to a signal of the first signal terminal and a signal of the second read control terminal; and simultaneously precharging a voltage to the third signal terminal by using the second precharge circuit.

This specification further provides a memory. The memory may include any one of the foregoing read-write conversion circuits.

The memory provided in this embodiment may have the same technical feature and working principle as the foregoing read-write conversion circuit. The technical feature and working principle are described above in detail, and details are not repeatedly described herein.

A person skilled in the art can easily figure out other embodiments of the present invention after considering the specification and practicing the invention that is disclosed herein. This application is intended to cover any variations, functions, or adaptive changes of the present invention. These variations, functions, or adaptive changes comply with general principles of the present invention and include common knowledge or a commonly used technical means that is in the technical field and that is not disclosed in the present invention. The specification and the embodiments are merely considered as examples, and the actual scope and spirit of the present invention are specified by the claims.

The present invention is not limited to the accurate structures that are described above and that are shown in the accompanying drawings, and various modifications and changes may be made without departing from the scope of the present invention. The scope of the present invention is limited only by the appended claims.

What is claimed is:

1. A read-write conversion circuit, comprising:
   a first precharge circuit, connected to a first precharge control terminal, a first power supply terminal, a first signal terminal, and a second signal terminal, and configured to transmit a signal of the first power supply terminal to the first signal terminal and the second signal terminal in response to a signal of the first precharge control terminal;
   a positive feedback circuit, connected to the first signal terminal, the second signal terminal, and a second power supply terminal, and configured to transmit a signal of the second power supply terminal to the second signal terminal in response to a signal of the first signal terminal and simultaneously disconnect the first signal terminal and the second power supply terminal in response to a signal of the second signal terminal, and configured to transmit a signal of the second power supply terminal to the first signal terminal in response to a signal of the second signal terminal and simultaneously disconnect the second signal terminal and the second power supply terminal in response to a signal of the first signal terminal;
   a second precharge circuit, configured to precharge a voltage to a third signal terminal and a fourth signal terminal;
   a fourth switch unit having a control terminal connected to a first write control terminal, a first terminal connected to the third signal terminal, and a second terminal connected to the first signal terminal;
   a sixth switch unit having a control terminal connected to the third signal terminal, and a first terminal connected to the second signal terminal;
   a seventh switch unit having a control terminal connected to the first write control terminal, a first terminal connected to a second terminal of the sixth switch unit, and a second terminal connected to a third power supply terminal;
   an eighth switch unit having a control terminal connected to a second write control terminal, a first terminal connected to the second signal terminal, and a second terminal connected to the fourth signal terminal;
   a tenth switch unit having a control terminal connected to the fourth signal terminal, and a first terminal connected to the first signal terminal;
   an eleventh switch unit having a control terminal connected to the second write control terminal, a first terminal connected to a second terminal of the tenth switch unit, and a second terminal connected to the third power supply terminal;
   a twelfth switch unit having a control terminal connected to the second signal terminal, and a first terminal connected to the third signal terminal;
   a thirteenth switch unit having a control terminal connected to a first read control terminal, a first terminal connected to a second terminal of the twelfth switch unit, and a second terminal connected to the third power supply terminal;
   a fourteenth switch unit having a control terminal connected to the first signal terminal, and a first terminal connected to the fourth signal terminal; and
   a fifteenth switch unit having a control terminal connected to a second read control terminal, a first terminal connected to a second terminal of the fourteenth switch unit, and a second terminal connected to the third power supply terminal.

2. The read-write conversion circuit of claim 1, wherein the positive feedback circuit comprises:
   a fifth switch unit having a control terminal connected to the first signal terminal, a first terminal connected to the second power supply terminal, and a second terminal connected to the second signal terminal; and
   a ninth switch unit having a control terminal connected to the second signal terminal, a first terminal connected to the second power supply terminal, and a second terminal connected to the first signal terminal.

3. The read-write conversion circuit of claim 1, wherein the first precharge circuit comprises:
   a first switch unit having a control terminal connected to the first precharge control terminal, a first terminal connected to the first power supply terminal, and a second terminal connected to the first signal terminal;
   a second switch unit having a control terminal connected to the first precharge control terminal, a first terminal connected to the first power supply terminal, and a second terminal connected to the second signal terminal; and
   a third switch unit having a control terminal connected to the first precharge control terminal, a first terminal connected to the first signal terminal, and a second terminal connected to the second signal terminal.

4. The read-write conversion circuit of claim 2, wherein the fifth switch unit is a P-type transistor, and the sixth switch unit is an N-type transistor; and
   the signal of the second power supply terminal is a high-level signal, and a signal of the third power supply terminal is a low-level signal.

5. The read-write conversion circuit of claim 2, wherein the fifth switch unit is an N-type transistor, and the sixth switch unit is a P-type transistor; and
   the signal of the second power supply terminal is a low-level signal, and a signal of the third power supply terminal is a high-level signal.

6. The read-write conversion circuit of claim 2, wherein the ninth switch unit is a P-type transistor, and the tenth switch unit is an N-type transistor; and
   the signal of the second power supply terminal is a high-level signal, and a signal of the third power supply terminal is a low-level signal.

7. The read-write conversion circuit of claim 2, wherein the ninth switch unit is an N-type transistor, and the tenth switch unit is a P-type transistor; and
   the signal of the second power supply terminal is a low-level signal, and a signal of the third power supply terminal is a high-level signal.

8. The read-write conversion circuit of claim 1, wherein the twelfth switch unit is an N-type transistor, a signal of the third power supply terminal is a low-level signal, and the second precharge circuit is configured to precharge a high-level signal to the third signal terminal and the fourth signal terminal.

9. The read-write conversion circuit of claim 1, wherein the twelfth switch unit is a P-type transistor, a signal of the third power supply terminal is a high-level signal, and the second precharge circuit is configured to precharge a low-level signal to the third signal terminal and the fourth signal terminal.

10. The read-write conversion circuit of claim 1, wherein the fourteenth switch unit is an N-type transistor, a signal of the third power supply terminal is a low-level signal, and the second precharge circuit is configured to precharge a high-level signal to the third signal terminal and the fourth signal terminal.

11. The read-write conversion circuit of claim 1, wherein the fourteenth switch unit is a P-type transistor, a signal of the third power supply terminal is a high-level signal, and the second precharge circuit is configured to precharge a low-level signal to the third signal terminal and the fourth signal terminal.

12. A read-write conversion circuit driving method for driving the read-write conversion circuit of claim 1, comprising:
   a signal write stage, comprising:
      a first write stage comprising:
         inputting a valid level signal to the first precharge control terminal to transmit a signal of the first power supply terminal to the first signal terminal and the second signal terminal in response to the valid level signal of the first precharge control terminal by using the first precharge circuit; and
      a second write stage comprising:
         inputting a first to-be-written signal to the third signal terminal to transmit the first to-be-written signal of the third signal terminal to the first signal terminal in response to a signal of the first write control terminal and transmit a signal of the second power supply terminal to the second signal terminal in response to a signal of the first signal terminal, or transmit a signal of the third power supply terminal to the second signal terminal in response to a signal of the first write control terminal and a signal of the third signal terminal; and simultaneously writing a second to-be-written signal to the fourth signal terminal; or
         inputting a third to-be-written signal to the fourth signal terminal to transmit the third to-be-written signal of the fourth signal terminal to the second signal terminal in response to a signal of the second write control terminal and transmit a signal of the second power supply terminal to the first signal terminal in response to a signal of the second signal terminal, or transmit a signal of the third power supply terminal to the first signal terminal in response to a signal of the second write control terminal and a signal of the fourth signal terminal; and simultaneously writing a fourth to-be-written signal to the third signal terminal; and
   a signal read stage, comprising:
      a first read stage comprising:
         precharging a voltage to the third signal terminal and the fourth signal terminal by using the second precharge circuit; and
      a second read stage comprising:
         inputting a valid level signal to the first read control terminal to transmit a signal of the third power supply terminal to the third signal terminal in response to a signal of the second signal terminal and a signal of the first read control terminal; and simultaneously precharging a voltage to the fourth signal terminal by using the second precharge circuit; or
         inputting a valid level signal to the second read control terminal to transmit a signal of the third power supply terminal to the fourth signal terminal in response to a signal of the first signal terminal and a signal of the second read control terminal; and simultaneously precharging a voltage to the third signal terminal by using the second precharge circuit.

13. A memory, comprising a read-write conversion circuit, wherein the read-write conversion circuit comprises:
   a first precharge circuit, connected to a first precharge control terminal, a first power supply terminal, a first signal terminal, and a second signal terminal, and configured to transmit a signal of the first power supply terminal to the first signal terminal and the second signal terminal in response to a signal of the first precharge control terminal;
   a positive feedback circuit, connected to the first signal terminal, the second signal terminal, and a second power supply terminal, and configured to transmit a signal of the second power supply terminal to the second signal terminal in response to a signal of the first signal terminal and simultaneously disconnect the first signal terminal and the second power supply terminal in response to a signal of the second signal terminal, and configured to transmit a signal of the second power supply terminal to the first signal terminal in response to a signal of the second signal terminal and simultaneously disconnect the second signal terminal and the second power supply terminal in response to a signal of the first signal terminal;
   a second precharge circuit, configured to precharge a voltage to a third signal terminal and a fourth signal terminal;
   a fourth switch unit having a control terminal connected to a first write control terminal, a first terminal connected to the third signal terminal, and a second terminal connected to the first signal terminal;
   a sixth switch unit having a control terminal connected to the third signal terminal, and a first terminal connected to the second signal terminal;
   a seventh switch unit having a control terminal connected to the first write control terminal, a first terminal connected to a second terminal of the sixth switch unit, and a second terminal connected to a third power supply terminal;
   an eighth switch unit having a control terminal connected to a second write control terminal, a first terminal connected to the second signal terminal, and a second terminal connected to the fourth signal terminal;
   a tenth switch unit having a control terminal connected to the fourth signal terminal, and a first terminal connected to the first signal terminal;
   an eleventh switch unit having a control terminal connected to the second write control terminal, a first terminal connected to a second terminal of the tenth switch unit, and a second terminal connected to the third power supply terminal;
   a twelfth switch unit having a control terminal connected to the second signal terminal, and a first terminal connected to the third signal terminal;
   a thirteenth switch unit having a control terminal connected to a first read control terminal, a first terminal connected to a second terminal of the twelfth switch unit, and a second terminal connected to the third power supply terminal;

a fourteenth switch unit having a control terminal connected to the first signal terminal, and a first terminal connected to the fourth signal terminal; and a fifteenth switch unit having a control terminal connected to a second read control terminal, a first terminal connected to a second terminal of the fourteenth switch unit, and a second terminal connected to the third power supply terminal.

14. The memory of claim 13, wherein the positive feedback circuit comprises:

a fifth switch unit having a control terminal connected to the first signal terminal, a first terminal connected to the second power supply terminal, and a second terminal connected to the second signal terminal; and a ninth switch unit having a control terminal connected to the second signal terminal, a first terminal connected to the second power supply terminal, and a second terminal connected to the first signal terminal.

15. The memory of claim 13, wherein the first precharge circuit comprises:

a first switch unit having a control terminal connected to the first precharge control terminal, a first terminal connected to the first power supply terminal, and a second terminal connected to the first signal terminal;

a second switch unit having a control terminal connected to the first precharge control terminal, a first terminal connected to the first power supply terminal, and a second terminal connected to the second signal terminal; and a third switch unit having a control terminal connected to the first precharge control terminal, a first terminal connected to the first signal terminal, and a second terminal connected to the second signal terminal.

16. The memory of claim 14, wherein the fifth switch unit is a P-type transistor, and the sixth switch unit is an N-type transistor; and the signal of the second power supply terminal is a high-level signal, and a signal of the third power supply terminal is a low-level signal.

17. The memory of claim 14, wherein the fifth switch unit is an N-type transistor, and the sixth switch unit is a P-type transistor; and the signal of the second power supply terminal is a low-level signal, and a signal of the third power supply terminal is a high-level signal.

18. The memory of claim 14, wherein the ninth switch unit is a P-type transistor, and the tenth switch unit is an N-type transistor; and the signal of the second power supply terminal is a high-level signal, and a signal of the third power supply terminal is a low-level signal.

19. The memory of claim 14, wherein the ninth switch unit is an N-type transistor, and the tenth switch unit is a P-type transistor; and the signal of the second power supply terminal is a low-level signal, and a signal of the third power supply terminal is a high-level signal.

20. The memory of claim 13, wherein the twelfth switch unit is an N-type transistor, a signal of the third power supply terminal is a low-level signal, and the second precharge circuit is configured to precharge a high-level signal to the third signal terminal and the fourth signal terminal.

* * * * *